United States Patent
Checco et al.

(10) Patent No.: US 10,189,704 B2
(45) Date of Patent: Jan. 29, 2019

(54) FORMATION OF SUPERHYDROPHOBIC SURFACES

(71) Applicant: Brookhaven Science Associates, LLC, Upton, NY (US)

(72) Inventors: Antonio Checco, Stony Brook, NY (US); Charles T. Black, New York, NY (US); Atikur Rahman, Ridge, NY (US); Benjamin M. Ocko, Stony Brook, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 215 days.

(21) Appl. No.: 14/897,441

(22) PCT Filed: Jun. 13, 2014

(86) PCT No.: PCT/US2014/042387
§ 371 (c)(1),
(2) Date: Dec. 10, 2015

(87) PCT Pub. No.: WO2014/201407
PCT Pub. Date: Dec. 18, 2014

(65) Prior Publication Data
US 2016/0137799 A1 May 19, 2016

Related U.S. Application Data

(60) Provisional application No. 61/835,576, filed on Jun. 15, 2013, provisional application No. 61/893,072, filed on Oct. 18, 2013.

(51) Int. Cl.
*B81C 1/00* (2006.01)
*H01L 21/027* (2006.01)
(Continued)

(52) U.S. Cl.
CPC ............ *B81C 1/00* (2013.01); *B81C 1/00111* (2013.01); *G02B 1/118* (2013.01); *G02B 1/18* (2015.01);
(Continued)

(58) Field of Classification Search
None
See application file for complete search history.

(56) References Cited

U.S. PATENT DOCUMENTS 8,741,158 B2 6/2014 Aytug et al.
9,120,669 B2 9/2015 Choi et al.
(Continued)

OTHER PUBLICATIONS

Y. Tseng et al., The Journal of Physical Chemistry C, vol. 115, year 2011, pp. 17725 and 17729.*
(Continued)

*Primary Examiner* — Jiong-Ping Lu
(74) *Attorney, Agent, or Firm* — Dorene M. Price (57) ABSTRACT

Technologies are described for methods and systems effective for etching nanostructures in a substrate. The methods may comprise depositing a patterned block copolymer on the substrate. The methods may comprise applying a precursor to the patterned block copolymer to generate an infiltrated block copolymer. The precursor may infiltrate into the first polymer block domain and generate a material. The methods may comprise applying a removal agent effective to remove the polymer block domains to the infiltrated block copolymer to generate a pattern of the material. The methods may comprise etching the substrate. The pattern of the material may mask the substrate to pattern the etching. The etching may be performed under conditions to produce nanostructures in the substrate. The methods may comprise removing the pattern of the material and coating the nanostructures and the surface of the substrate with a hydrophobic coating.

12 Claims, 4 Drawing Sheets

(51) Int. Cl.
    *G03F 7/40*    (2006.01)
    *G03F 7/00*    (2006.01)
    *G02B 1/118*   (2015.01)
    *H01L 21/033*  (2006.01)
    *H01L 21/3065* (2006.01)
    *H01L 21/308*  (2006.01)
    *G02B 1/18*    (2015.01)

(52) U.S. Cl.
    CPC .......... *G03F 7/0002* (2013.01); *G03F 7/405* (2013.01); *H01L 21/0271* (2013.01); *H01L 21/0273* (2013.01); *H01L 21/0337* (2013.01); *H01L 21/3065* (2013.01); *H01L 21/3086* (2013.01); *B81C 2201/0149* (2013.01); *H01J 2237/334* (2013.01)

(56)　　　　　　References Cited

U.S. PATENT DOCUMENTS

| | | | |
|---|---|---|---|
| 9,207,363 | B2 | 12/2015 | Stoia et al. |
| 2007/0231542 | A1* | 10/2007 | Deng .................. B08B 17/06 428/141 |
| 2010/0216311 | A1 | 8/2010 | Tamaki |
| 2012/0052241 | A1 | 3/2012 | King et al. |
| 2012/0241411 | A1* | 9/2012 | Darling ................ G03F 7/405 216/67 |
| 2013/0192993 | A1* | 8/2013 | Mardilovich ....... B81C 1/00206 205/50 |
| 2013/0244352 | A1* | 9/2013 | Takahashi ......... H01L 21/30604 438/21 |

OTHER PUBLICATIONS

E. Martines et al., Nano Letters, vol. 5, year 2005, pp. 2097-2103.*
Raut, H. K., et al., "Anti-reflective coatings: A critical, in-depth review", Energy Environ. Sci., (2011) vol. 4, 3779-3804.
Park, M., et al., "Block Copolymer Lithography: Periodic Arrays of ~1011 Holes in 1 Square Centimeter", Science, vol. 276, 1401-04 (1997).
Kuo, C.-W., et al., "Fabrication of Size-Tunable Large-Area Periodic Silicon Nanopillar Arrays with Sub-10-nm Resolution", J. Phys. Chem. B (2003) vol. 107, pp. 9950-9953.
Peng, Q., et al., "A Route to Nanoscopic Materials via Sequential Infiltration Synthesis on Block Copolymer Templates", ACS Nano, vol. 5, No. 6, (2011) pp. 4600-4606.
Samukawa, S., "Ultimate Top-down Etching Processes for Future Nanoscale Devices: Advanced Neutral-Beam Etching", Japanese Journal of Applied Physics, vol. 45, No. 4A (2006) pp. 2395-2407.
Wang, M., et al., "High energy electron fluxes in dc-augmented capacitively coupled plasmas. II. Effects on twisting in high aspect ratio etching of dielectrics", J. of Applied Physics, vol. 107, (2010) pp. 023309-1 to 023309-11.
Bouchoule, S., et al., "Effect of Cl2- and HBr-based inductively coupled plasma etching on InP surface composition analyzed using in situ x-ray photoelectron spectroscopy", J. Vac. Sci. Technol. A vol. 30, No. 3 (2012) pp. 031301-1-031301-11.
Toma, M., "Fabrication of Broadband Antireflective Plasmonic Gold Nanocone Arrays on Flexible Polymer Films", Nano Lett. (2013) vol. 13, pp. 6164-6169.
Her, E. K., "Superhydrophobic Transparent Surface of Nanostructured Poly(Methyl Methacrylate) Enhanced by a Hydrolysis Reaction", Plasma Process. Polym. (2013) vol. 10, pp. 481-488.

* cited by examiner

FORMATION OF SUPERHYDROPHOBIC SURFACES

CROSS REFERENCE TO RELATED APPLICATIONS

This application claims priority to provisional application No. 61/835,576, filed Jun. 15, 2013, entitled "Nanostructured Superhydrophobic Surfaces and Method for Making the same", and provisional application 61/893,072, filed Oct. 18, 2013, entitled "Nanostructured Surfaces", the entirety of both of these applications is hereby incorporated by reference in their entirety.

STATEMENT OF GOVERNMENT RIGHTS

The present application was made with government support under contract number DE-AC02-98CH10886 awarded by the U.S. Department of Energy. The United States government has certain rights in the invention(s).

FIELD OF THE INVENTION

This disclosure relates generally to superhydrophobic nanostructures and the formation of surfaces exhibiting strong repellency to water.

BACKGROUND

Superhydrophobic (SH) surfaces exhibit strong water repellency (in some examples, through creation of a water contact angle greater than 160 degrees) and very little friction between the water and the SH surface. The super hydrophobicity is also sometimes referred to as the "lotus effect" named after the superhydrophobic leaves of the lotus plant. The SH function may be achieved by texturing a substrate followed by functionalization with hydrophobic methyl or trifluoromethyl groups. Water in contact with a SH surface effectively rests on a composite solid/gas interface because the surface creates an interface so that it is energetically unfavorable for the water to penetrate the surface. The texture enhances the contact angle between the water and SH surface, and also dramatically reduces the liquid/solid friction.

SUMMARY

In some examples methods for etching nanostructures in a substrate are generally described. The methods may comprise depositing a patterned block copolymer on the substrate. The patterned block copolymer may include a first polymer block domain and a second polymer block domain. The methods may comprise applying a precursor to the patterned block copolymer on the substrate to generate an infiltrated block copolymer on the substrate. The precursor may infiltrate into the first polymer block domain and generate a material in the first polymer block domain. The precursor may not infiltrate into the second polymer block domain. The methods may comprise applying a removal agent to the infiltrated block copolymer on the substrate to generate a pattern of the material on the substrate. The removal agent may be effective to remove the first polymer block domain and the second polymer block domain from the substrate. The removal agent may not be effective to remove the material in the first polymer block domain. The methods may comprise etching the substrate. The pattern of the material on the substrate may mask the substrate to pattern the etching. The etching may be performed under conditions to produce nanostructures in the substrate. The methods may comprise removing the pattern of the material from the substrate. The methods may comprise coating the nanostructures and the surface of the substrate with a hydrophobic coating.

In some examples, a surface is generally described. The surface may comprise a nanotexture formed by pillars in the substrate. Each pillar may have a top, a base and a pillar center. Each pillar may have a substantially circular top cross-section and a base width of about 5 nm to about 100 nm. The pillars may be patterned in an array with distances of about 5 nm to about 100 nm between adjacent pillar centers. The nanotextures may comprise a hydrophobic coating on the pillars and substrate.

In some examples, methods for etching nanostructures in a substrate are generally described. The methods may comprise depositing a patterned block copolymer on the substrate. The patterned block copolymer may include a first polymer block domain and a second polymer block domain. The methods may comprise applying a precursor to the patterned block copolymer on the substrate to generate an infiltrated block copolymer on the substrate. The precursor may infiltrate into the first polymer block domain and generate a material in the first polymer block domain. The precursor may not infiltrate into the second polymer block domain. The methods may comprise applying a removal agent to the infiltrated block copolymer on the substrate to generate a pattern of the material on the substrate. The removal agent may be effective to remove the first polymer block domain and the second polymer block domain from the substrate. The removal agent may not be effective to remove the material in the first polymer block domain. The methods may comprise etching the substrate. The pattern of the material on the substrate may mask the substrate to pattern the etching. The etching may be performed under conditions to produce pillars sized, shaped, and arranged so that when water contacts the pillars the water forms a contact angle above 160 degrees with the pillars in the substrate. The pillars may be patterned in an array with distances of about 5 nm to about 100 nm between adjacent pillar centers. The methods may comprise removing the pattern of the material from the substrate. The methods may comprise coating the pillars and the surface of the substrate with octadecyltrichlorosilane.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

As used herein any compound, material or substance which is expressly or implicitly disclosed in the specification and/or recited in a claim as belonging to a group or structurally, compositionally and/or functionally related compounds, materials or substances, includes individual representatives of the group and all combinations thereof.

Figure 1:
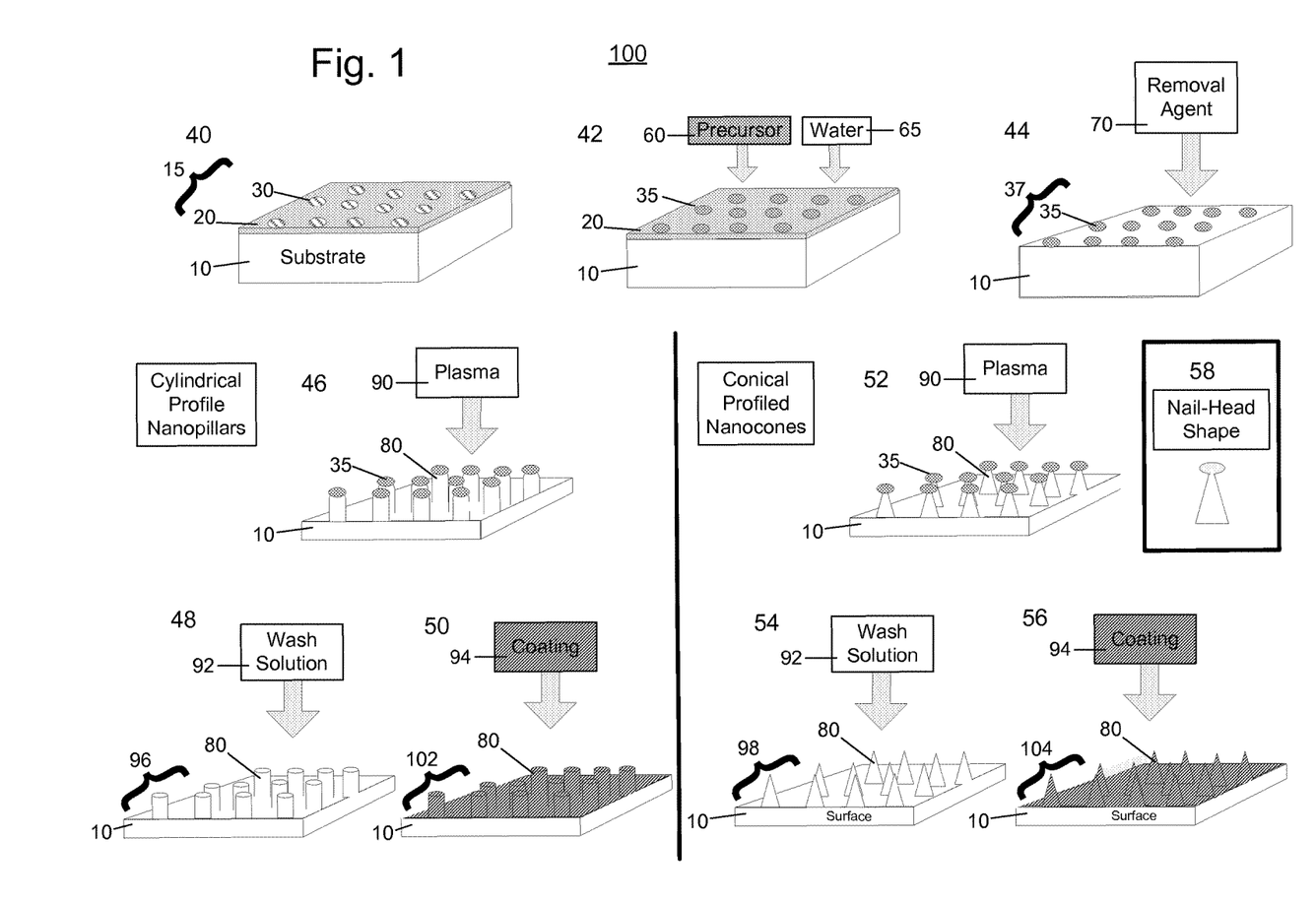
FIG. 1 illustrates an example of a system that can be utilized for formation of superhydrophobic surfaces.

FIG. 1 illustrates an example system 100 that can be utilized for formation of superhydrophobic surfaces, arranged in accordance with at least some embodiments presented herein. As discussed in more detail below, a substrate may be processed to form a superhydrophobic surface with a water contact angle above 160 degrees.

System 100 may include a substrate 10 and a block copolymer 15. Block copolymer 15 may be deposited on a substrate 10. Substrate 10 may be any substrate for which superhydrophobicity is desired such as various types of polymers (e.g., polyimides), silicon nitride, glass, or silicon. Block copolymer 15 may be a diblock copolymer, triblock or other multiblock copolymer. Block copolymer 15 may be a diblock copolymer and may include two polymer domains comprised of polymer blocks 20 and 30. Polymer blocks 20 and 30 may be immiscible and may be bound together by covalent bonds. As shown at 40 in FIG. 1, block copolymer 15 may include a patterning of the first domain defined by polymer blocks 20 and a second domain defined by polymer blocks 30. The pattern may be defined by a placement of polymer block 20 and polymer block 30 within block copolymer 15. The pattern may be formed in block copolymer 15 as block copolymer 15 phase-separates to minimize available free energy. Nanostructure patterns and dimensions of polymer blocks 20 and 30 may be adjusted by adjusting molecular weight ratio between polymer block 20 and polymer block 30.

Polymer blocks 20 and 30 in block copolymer 15 may each include respective characteristics and properties. The characteristics and properties of polymer block 20 may be different from the characteristics and properties of polymer block 30. For example, properties of polymer block 30 may include an affinity to a particular substance and properties of polymer block 20 may not include an affinity to the particular substance. Differences in characteristics and properties of polymer block 20 from polymer block 30 may allow block copolymer 15 to be used to generate a pattern on substrate 10.

Block copolymer 15 may be deposited on substrate 10 by spin coating/casting, blade coating, or continuous roll-to-roll processing. For example, a diblock polymer may be dissolved in a solvent and applied to substrate 10. The diblock polymer may be spin coated on substrate 10 to form a 20-50 nm thick layer and then heated in an oven at about 100-140° C. for about 30 minutes to generate block copolymer 15. Block copolymer 15 may, for example, be polystyrene-block-polyethelyneoxide (PS:PEO), polystyrene-block-poly (methylmethacrylate) (PS:PMMA) or any other block copolymer. PS:PMMA may be asymmetric material with molecular weights ranging between 48 kg/mol and 176 kg/mol and molecular weight ratio of 70:30 PS:PMMA. The pattern of block copolymer 15, which is defined by the placement of polymer blocks 20 and polymer blocks 30, may be for example, cylindrical. A cylindrical pattern of block copolymer 15 may include hexagonally arranged features with separations between 28 nm and 60 nm. For example, when block copolymer 15 is PS:PMMA, hexagonally close packed PMMA domains may be in a matrix of PS. PMMA as polymer block 30 and PS as polymer block 20 is illustrated at 40.

As shown at 42, block copolymer 15 may be chemically transformed into a material, such as an inorganic template, by selectively infiltrating one of polymer blocks 20, 30 with a precursor 60. Precursor 60 may be a metal organic precursor such as tri-methyl aluminum (TMA). Polymer blocks 20 and 30 in block copolymer 15, and precursor 60, may be selected to control features of the inorganic template as desired. For example, the size and spacing between polymer blocks 20, 30 may be selected, and the polymer block 20, 30 which may be infiltrated by precursor 60 may be selected to control features of the inorganic template. For example, precursor 60 and polymer blocks 20 30, may be selected so that precursor 60 infiltrates polymer block 30 and precursor 60 may not infiltrate polymer block 20.

Water 65 may be applied to the block copolymer after infiltration by precursor 60. Water 65 may react with precursor 60, infiltrated in one of polymer block 20 or 30, to form a material such as metal oxide 35. For example, when precursor 60 is TMA, TMA may infiltrate in polymer block 30, in examples where polymer block 30 is PMMA. TMA infiltrated in polymer block 30 may react with water 65 and oxidize, forming metal oxide 35, such as forming aluminum oxide ($Al_2O_3$). Metal oxide 35 formed by precursor 60 infiltrated into polymer block 30, and reacted with water 65, may be patterned and in the shape of polymer block 30. Metal oxide 35 may be more robust that block copolymer 15 and polymer blocks 20, 30. Metal oxide 35 may form a more robust template or mask that may be used for etching a nanostructure in substrate 10 to form a superhydrophobic surface.

Figure 2A:
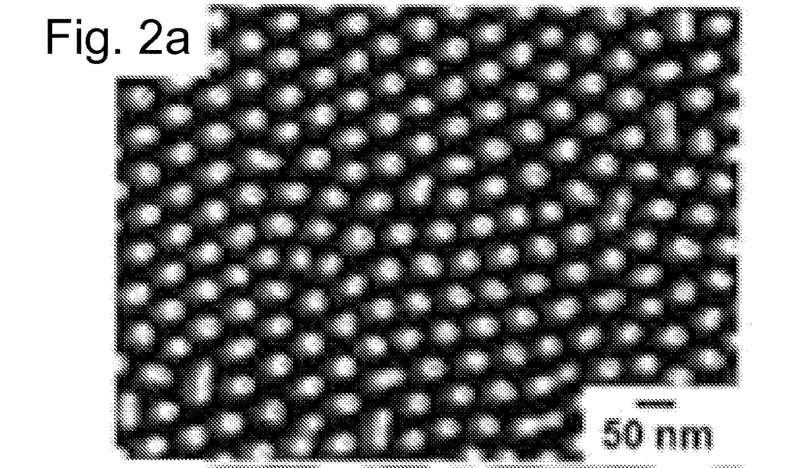
FIG. 2a is a top view SEM (scanning electron microscope) image of aluminum oxide formed within PMMA domains.
Figure 2B:
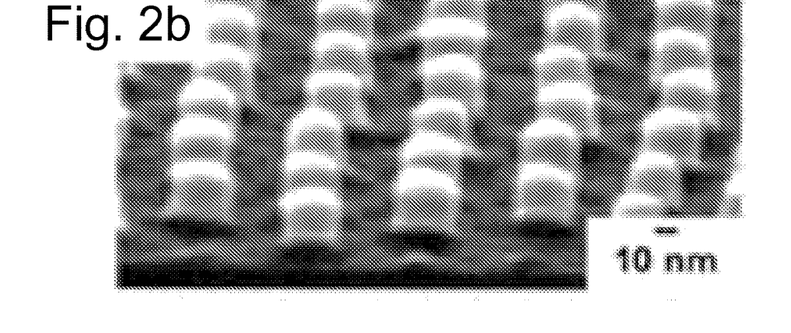
FIG. 2b is a side perspective view SEM image of aluminum oxide formed within PMMA domains.

Metal oxide 35 may form the inorganic template on substrate 10. As shown at 44, a removal agent 70 may be applied to substrate 10 to remove polymer blocks 20 and 30 from substrate 10, leaving metal oxide dots 35 and thereby defining an inorganic template 37. Polymer blocks 20, 30, that are not infused with precursor 60, may be organic materials and may be removed from substrate 10 by removal agent 70. Removal agent 70 may be an oxygen plasma or heating in the presence of oxygen to an appropriate temperature (e.g., between 400-500 C) and may remove organic materials, including polymer blocks 20, 30, from substrate 10. Inorganic template 37, patterned by polymer block 30, may be left on substrate 10 after applying removal agent 70. Metal oxide dots 35 may form a quasi-ordered array of uniform metal oxide dots with size and spacing determined by placement of polymer blocks 20, 30 in block copolymer 15. For example, alumina metal oxide 35 formed from polymer block 15 of PS:PMMA and precursor 60 of TMA may form inorganic template 37 with hexagonally arranged features with separations between 30 nm and 60 nm. FIG. 2a shows a top view SEM image and FIG. 2b shows a side perspective view SEM image of aluminum oxide formed by block selective synthesis within PMMA domains.

As shown at 46 and 52, plasma 90 may be applied to substrate 10 with metal oxide template 37, to etch substrate 10 resulting in the formation of nanostructures 80 in substrate 10. Plasma 90 may produce a nanotextured substrate by etching a portion of substrate 10 exposed by metal oxide template 37. Plasma 90 may etch substrate 10 exposed by metal oxide template 37 and plasma 90 may not etch substrate masked by metal oxide template 37. Plasma 90 may etch nanostructures 80 in substrate 10 such as to form or sculpt nanostructures 80 in substrate 10. Nanostructures 80 etched in substrate 10 may be pillars, where each pillar has a top, a base and a pillar center, a substantially circular top cross-section and a base width of about 5 nm to about 100 nm. Pillar nanostructures 80 may taper from a wider base to a narrower top. The tapering may be the angle of the inclination of the cone sidewall compared to the surface normal of substrate 10. The tapering angle may vary with the height of the pillar nanostructure 80. For example, a 75 nm tall conical pillar nanostructure 80 may have a taper angle of approximately 6 degrees while a 170 nm tall conical pillar nanostructure 80 may have a taper angle of approximately 10 degrees. Pillar nanostructures 80 etched in substrate 10 may be patterned by metal oxide template 37. Metal oxide template 37 may pattern the etching of pillar nanostructures 80. For example, if metal oxide template 37 is metal oxide dots 35 patterned in an array with the center of each dot uniformly a set distance of about 5 nm to about 100 nm from the center of its surrounding dots, plasma 90 may etch pillar nanostructures 80 in substrate 10 patterned in an equivalent array. Pillar nanostructure 80 etched by plasma 90 may be patterned in an array with distances of about 5 nm to about 100 nm between adjacent pillar nanostructures 80. For example, pillar nanostructures 80 may be etched by plasma 90 in substrate 10 patterned in an array with distances of about 30 to about 60 nm between centers of adjacent nanostructures 80.

Plasma conditions and etch time may be adjusted to control the height (e.g. a depth that the plasma etches into substrate 10) and the profile of nanostructures 80 left in substrate 10 after etching. For example, plasma 90 may produce nanostructures 80 that are pillars. Pillars may have a cylindrical profile (illustrated at 46, 48) or in a conical profile (illustrated at 52, 54). A resultant surface that includes substrate 10 and the formed nanostructures 80 may be spiky, rough or both and may define a nanotexture. Nanostructures 80 etched in substrate 10 may be, for example, pillars. Pillar nanostructures 80 may include various pillar profiles such as tapered conical profile nanocones, angle-sided conical profile nanocones, cylindrical pillars, other profile pillars, straight-sided pillars, re-entrant curvature shapes (such as a "nail-head" shape), or hourglass shape. An aspect ratio of the formed pillars may be about 1:1 (height to average width ratio) to about 20:1 (height to average width ratio). Resultant surfaces that include the above mentioned nanostructures 80 may have different wetting properties.

Cylindrical profile nanopillars may be etched in substrate 10 when plasma 90 is a combination of gases that etch substrate 10 isotropically. For example, plasma 90 may etch in one direction vertically down to form cylindrical profile nanopillars and not etch substrate 10 under metal oxide dots 35. Plasma 90 may be 50% oxygen, 50% sulfur hexafluoride ($SF_6$) and may form cylindrical profile nanopillars at $-100°$ C. Cylindrical nanopillars dimensions may be adjusted by adjusting etch time, plasma pressure and the radio frequency power of plasma 90. In an example, etch time may range from 1 to 10 seconds and the radio frequency power of plasma 90 may range from 10 to 100 watts.

Conical profile nanotextures may be etched in substrate 10 when plasma 90 is a combination of gases that etch substrate 10 slightly isotropically, etching down vertically and laterally to form conical nanotextures. In an example, plasma 90 may etch substrate 10 under metal oxide dots 35. Plasma 90 may be hydrogen bromide (HBr):chlorine ($Cl_2$): oxygen ($O_2$)=100:100:25 standard cubic centimeter per minute (sccm) and may form conical profile nanopillars at room temperature. Conical nanocones dimensions may be adjusted by adjusting etch time, plasma pressure and the power of radio frequency of plasma 90. Etch time may range from 1 to 10 seconds and power of radio frequency of plasma may range from 10 to 100 watts. Longer etch times may form sharper conical nanotextures and may result in metal oxide dots 35 falling off of conical nanotexture tips as the tips of the conical nanocones diminish in size. The tip or point of etched conical nanotextures may have a curvature radius of about 5 nm.

As shown at 58, adjustment of plasma 90 gases and etching conditions may etch substrate 10 forming pillared nanopatterned surfaces with re-entrant curvature (such as for example, a "nail-head" shape). Nanostructures 80 may have "nail-head" shaped profiles. Nanopatterned surfaces with "nail-head" shaped nanostructures may exhibit both superhydrophobicity and oil repellency and may be omniphobic. The "nail-head" shape may better prevent water or oil from penetrating into the patterned surface nanostructures.

After plasma etching, a wash solution 92 may be applied to substrate 10 and metal oxide 35 as illustrated at 48 and 54. Metal oxide 35 may be washed off of substrate 10 and may be washed off etched pillars with wash solution 92. Wash solution 92 may be a dilute acid, for example, buffered hydrofluoric acid (50:1). Removal of metal oxide dots 35, by wash solution 92, may produce a nanotextured surface; at 48, a cylindrical nanotextured surface 96 and at 54, a conical nanotextured surface 98.

Coating 94 may be applied to nanotextured surface 96, 98. Coating 94 may be conformal such that coating 94 may coat, but not completely fill in, the etched space between nanostructures 80. Coating 94 may be a hydrophobic coating, such as a waxy material, a TEFLON-like material, or a silane-based compound, such as, for example, octadecyltrichlorosilane (OTS). Coating 94 may be about 1-3 nm thick and may have a strong affinity to substrate 10. Coating 94 may be a monolayer about one molecule thick and may enhance the hydrophobicity of nanotextured surface 96, 98. Nanotextured surface 96, 98, coated with coating 94, may form superhydrophobic surface 102, 104 as illustrated at 50 and 56.

For example, nanotextured surface 96, 98 may be rendered hydrophobic by passivating substrate 10 with a 2.5 nm thick OTS monolayer. Substrate 10 may be first cleaned in piranha solution (3:1 volume ratio of sulfuric acid and hydrogen peroxide). Then substrate 10 may be immersed in a solution having a concentration of about 1-10 mM, about 2-8 mM, about 4-6 mM, or about a 5 mM solution of OTS molecules in bicyclohexyl for about 10 hours.

EXAMPLE 1

Surfaces were fabricated by the above method with either cylindrical profiled nanopillars or tapered cones with conical profile nanopillars with different height and spacing (dimensions summarized in Table 1). The hydrophobicity of flat and nanotextured surfaces was estimated by measuring the advancing contact angle and hysteresis of millimeter-sized, sessile water droplets. Nanotexturing dramatically enhanced the hydrophobicity of both cylindrical profiled pillars and conical profiled tapered cones, compared to chemically identical flat samples (Table 1). However, the quantitative behavior depends strongly on the shape of the nanotexture. While the cylindrical profile nanopillar texture increased the contact angle to as high as about 150°, it also increased the contact angle hysteresis to about 30°, irrespective of cylindrical profile pillar height and spacing differences (Table 1).

TABLE 1

(Average feature spacing, feature height, advancing water angle, and hysteresis of nanopatterned surfaces)

| Surface Texture | Spacing (±1 nm) | Feature height (±5 nm) | $\theta_{adv}$ (±2°) | $\Delta\theta$ (±3°) |
|---|---|---|---|---|
| Flat | NA | NA | 112° | 6° |
| 52 nm spaced pillars | 52 nm | 180 nm | 150° | 30° |
| 30 nm spaced pillars | 30 nm | 75 nm | 137° | 27° |
| 52 nm spaced cones 1 | 52 nm | 75 nm | 165° | 5° |
| 52 nm spaced cones 2 | 52 nm | 180 nm | 165° | 6° |
| 30 nm spaced cones | 30 nm | 95 nm | 162° | 7° |

The conical profile tapered cone surfaces exhibited superhydrophobic behavior and had advancing contact angles exceeding ~160° and contact angle hysteresis smaller than 10°. These results demonstrated that identical texture spacings and heights within the range of sizes that were investigated can have dramatically different wetting behavior due to only the texture's geometry.

The data was interpreted using a Cassie-Baxter (CB) model in which a drop of water resting on a nanotextured surface makes contact only with the top of the textures without significantly penetrating into the structures. For identical feature geometry and spacing, the contact angle was independent of the feature height (Table 1). The morphology of the texture top surface and the feature density determine the area fraction of solid in contact with the liquid, denoted as $\varphi_{SL}$. For hexagonal arrays of pillars:

$$\varphi_{SL} \sim \frac{2\pi r^2}{d^2\sqrt{3}} \tag{1}$$

where r is the radius of the cylindrical profile pillar and d the pillar spacing. Substituting the geometrical parameters in Table 1 using the average nanopillar radius, r~15 nm for 52 nm spaced pillars and r~10 nm for 30 nm spaced pillars (Table 1, measured from SEM images), it is possible to obtain $\varphi_{SL}$=30% and $\varphi_{SL}$=40%, respectively. The CB angle is given by:

$$\cos\theta_{CB}=\varphi_{SL}(\cos\theta_F+1)-1 \tag{2}$$

yielding $\theta_{CB}$=144° for 52 nm spaced pillars and $\theta_{CB}$=138° for 30 nm spaced pillars, in good agreement with the measured values of 150° and 137° to within 4% and 1%, respectively.

The receding angle is provided by:

$$\cos\theta_R=2\varphi_{SL}-1 \tag{3}$$

yielding $\theta_R$=114° for 52 nm spaced pillars and $\theta_R$=102° for 30 nm spaced pillars, which is similar to the measured receding contact angle of 120° and 110°, respectively.

The solid-liquid fraction for the conical profile tapered cone surfaces can similarly be estimated using Eq. 1 by replacing the nanopillar radius with the typical curvature radius of the conical profile nanocone's tip, r~5 nm (similar for both the 52 nm and 30 nm spaced cones). $\varphi_{SL}$=4% and $\theta_{CB}$=168°, for the 52 nm spaced cones, and $\varphi_{SL}$=10% and $\theta_{CB}$=160° for the 30 nm spaced cones. These numbers are in good agreement with the experimental values in the range 162°-165°. The receding contact angle for the nanocone surfaces estimated using Eq. 3 is 157° for the 52 nm spaced cones, and 143° for the 30 nm spaced cones, which is also comparable to the measured values of 160° and 155°, respectively.

EXAMPLE 2

Figure 3A:
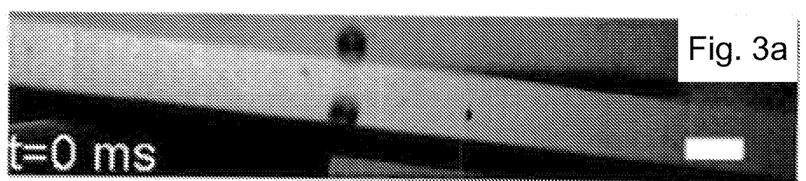
FIG. 3a is an image of a water drop impacting a surface nanotextured with tapered nanocones at time t=0 ms.
Figure 3B:
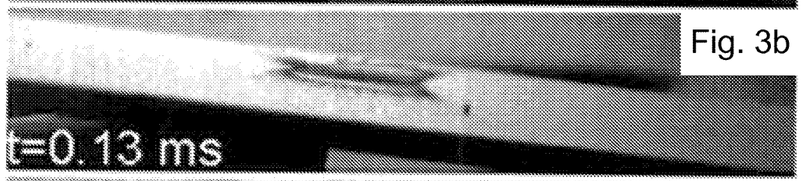
FIG. 3b is an image of a water drop impacting a surface nanotextured with tapered nanocones at time t=0.13 ms.
Figure 3C:
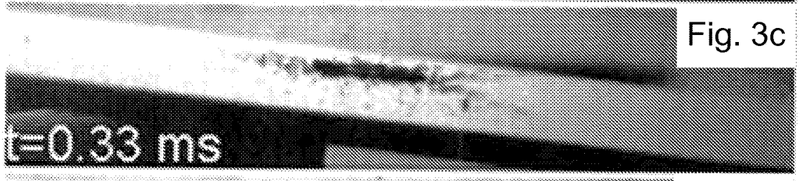
FIG. 3c is an image of a water drop impacting a surface nanotextured with tapered nanocones at time t=0.33 ms.
Figure 3D:
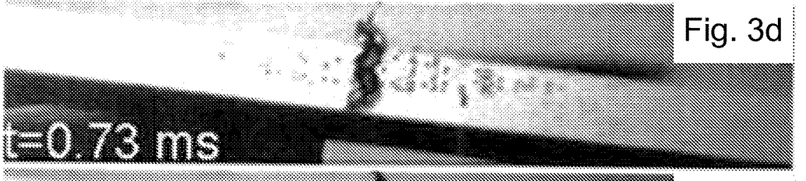
FIG. 3d is an image of a water drop impacting a surface nanotextured with tapered nanocones at time t=0.73 ms.
Figure 3E:
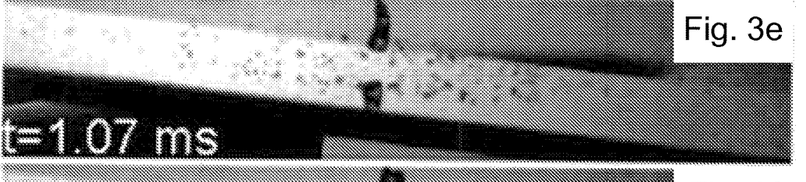
FIG. 3e is an image of a water drop impacting a surface nanotextured with tapered nanocones at time t=1.07 ms.
Figure 3F:
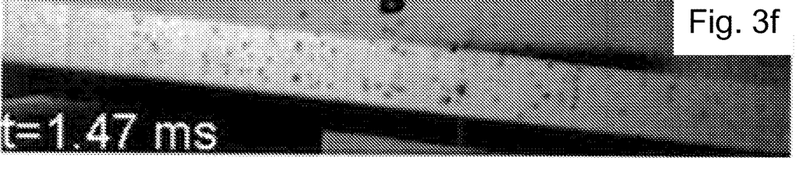
FIG. 3f is an image of a water drop impacting a surface nanotextured with tapered nanocones at time t=1.47 ms.

The robustness of the conical profile tapered-cone nanotexture surfaces were investigated with water droplet impingement experiments. A pressurized syringe and a narrow needle (0.13 mm internal diameter) were used to produce a spray of water droplets ranging in size from 0.3 to 2 mm. The spray was aimed at the patterned substrates with the needle positioned 0.75 m above the sample. The impact of the droplet on a textured surface was captured using a high-speed camera (PHOTRON SA3), recorded at a frame rate of $3\times10^4$ s$^{-1}$. In a representative splashing sequence (FIG. 3), a water droplet (diameter=0.5 mm) impacted a slightly tilted textured surface (tilt angle~6°) at a speed $V_0$=10±1 m s$^{-1}$, which was estimated from camera frames immediately preceding the impact (see FIG. 3a). The surface texture included conical profile tapered cones with 52 nm average spacing and 75 nm average height. Because of its speed and the surface superhydrophobicity, the droplet undergoes splashing with the formation of a corona with a thickened, undulated rim (see FIG. 3b). Subsequently, satellite droplets ejected from the rim, while the central portion of the drop flattened out (see FIG. 3c). The drop remnant recoiled and bounced off the surface (FIG. 3d), while the satellite drops spread radially outward from the impact zone (FIGS. 3e,f). Pinned drops are not observed at the impact point after the drop was bounced back within the optical resolution of the measurement (~50 μm). The drops did not infiltrate the texture of the surface remained in the CB state with the liquid on top of the texture during the impact. Similar results were found for the other tapered cone surfaces described in Table 1.

Infiltration pressure generated during droplet impact was compared with the static capillary pressure required to infiltrate the nanostructures. Immediately after impact, a "water hammer pressure" is generated due to the compression of liquid behind the shock wave. This pressure can be approximated as:

$$P_{WH} \sim 0.2\rho c V_0 \tag{4}$$

where ρ is the liquid density and c is the speed of sound in the liquid. The droplet impact generates a force of $P_{WH}$~3 MPa on the nanostructure. As the droplet contact line expands and its speed decreases, the pressure drops to the incompressible dynamic pressure provided by the Bernoulli equation:

$$P_B = \frac{\rho}{2} V_0^2 \qquad (5)$$

which is $P_B$~50 kPa.

The initial pressure ($P_C$) required to force the liquid/air interface inside the tapered cone nanostructure can be estimated by balancing capillary and hydrostatic forces:

$$P_C = \frac{4\pi \gamma r \cos(\theta - \alpha)}{\sqrt{3}\, d^2 - 2\pi r^2} \qquad (6)$$

where γ=7.2×10−2 N m−1 is the water surface tension, 2α~20° is the opening angle of the tapered cones, and r is the curvature radius of the three phase contact line wetting the cone's sidewall. Substituting r~5 nm for the curvature radius of the conical profile cone's tip, one can obtain $P_C$~0.2 MPa, which is smaller than $P_{WH}$ and suggests that liquid penetrates the nanotexture upon droplet impact. However, the conical profile tapered cone geometry increases the required infiltration pressure as the liquid penetrates further into the texture (as shown by Eq. 6). As the penetration depth increases, so does the length of the contact line (and therefore r) whereas the surface area of the liquid/air interface decreases, thereby raising PC. From Eq. 6, ~1 MPa is required to infiltrate 50% of the nanotexture volume, with ~5 MPa necessary for 95% infiltration. The conical profile tapered cone textures with 30 nm spacing were found to be even more robust. A pressure of ~0.7 MPa was required to initiate infiltration and ~2 MPa to infiltrate 50% of nanotexture volume. An absence of droplet pinning after rebound for all tapered cones surfaces investigated was found for impact speeds as high as 10 m s−1.

EXAMPLE 3

PS-b-PMMA thin films were prepared. Cylindrical phase polystyrene-block-poly(methyl methacrylate) (PS-b-PMMA) block copolymers with molecular weights of MW=99 kg/mol (PS:PMMA 64:35, polydispersity PD=1.09) and 48 kg/mol (PS:PMMA 31:17, PD=1.06) were mixed 1% by weight in toluene. Thin films were spin cast at 3000 RPM, 45 s, from solution on silicon wafers and annealed in vacuum (<1 Torr) at 200° C. for 12 hours. Prior to spin coating the block copolymer, substrates were coated with a PS-r-PMMA random copolymer brush (MW~11 kg/mol, PS:PMMA 52:48) by spin casting (0.5 wt % in toluene, 600 RPM), thermal annealing for 4 hours, and rinsing in toluene.

PS-b-PMMA templates were converted to aluminum oxide nanostructures by three sequential exposures to tri-methyl aluminum (TMA) (300 s, >5 Torr) and water vapor (300 s, >5 Torr) at 85° C. in a commercial atomic layer deposition system. Remaining organic material was removed by oxygen plasma (20 W RF power, 100 mTorr) for 2 minutes.

Reactive ion etching of structures with a conical profile was performed with a 50:50:10 ratio of HBr, $Cl_2$ and $O_2$ gas (10 mTorr, 60 W RF power, 250 W ICP (inductively coupled plasma)) at room temperature. The process included a brief breakthrough step using $BCl_3$ and $Cl_2$ (20:5 sccm, 10 mTorr, 100 W RF power, 800 W ICP power) for 10 sec. in order to uniformly initiate silicon etching.

Reactive ion etching of structures with a cylindrical pillar profile was performed using a 40:50 combination of $SF_6$ and $O_2$ gas at −100 C (12 mTorr, 15 W RF power, 800 W ICP). This process included a breakthrough step using $SF_6$:$O_2$ (40:50 sccm, 12 mTorr, 40 W RF power, 800 W ICP power) for 10 sec.

Remaining $Al_2O_3$ was removed using buffered hydrofluoric acid (50:1) for 30 sec. Samples were characterized by scanning electron microscopy (HITACHI S4800) operating at 20 kV.

Figure 4:
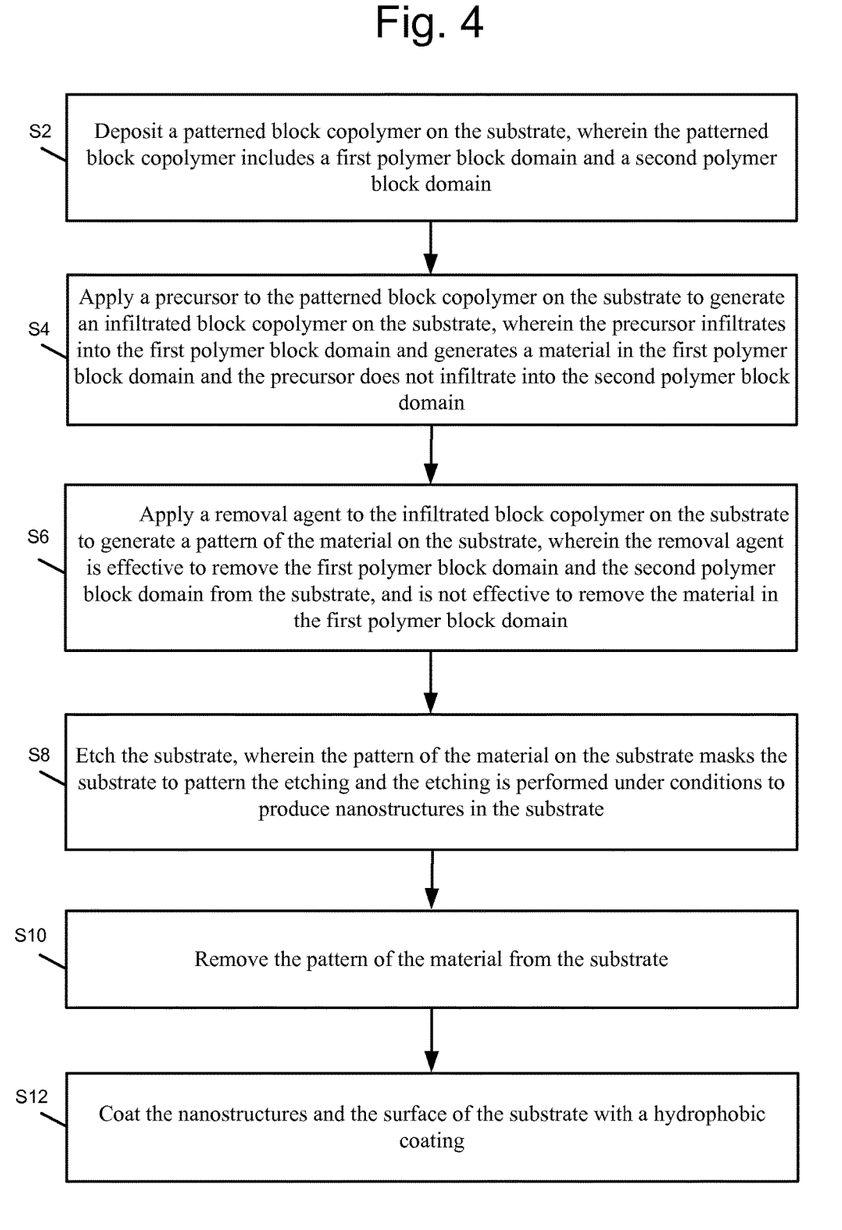
FIG. 4 illustrates a flow diagram of an example process for formation of superhydrophobic surfaces.

FIG. 4 illustrates a flow diagram of an example process for of an example process for formation of superhydrophobic surfaces, arranged in accordance with at least some embodiments presented herein. The process in FIG. 4 could be implemented using, for example, system 100 discussed above and may be used for formation of superhydrophobic surfaces. An example process may include one or more operations, actions, or functions as illustrated by one or more of blocks S2, S4, S6, S8, S10, and/or S12. Although illustrated as discrete blocks, various blocks may be divided into additional blocks, combined into fewer blocks, or eliminated, depending on the desired implementation.

Processing may begin at block S2, "Deposit a patterned block copolymer on the substrate, wherein the patterned block copolymer includes a first polymer block domain and a second polymer block domain." At block S2, a patterned block copolymer is deposited on a substrate. The patterned block copolymer may include a first polymer block and a second polymer block. The first polymer block and the second polymer block may each include respective characteristics and properties which may be used for patterning. The block copolymer may be deposited on the substrate by spin coating/casting, blade coating, or continuous roll-to-roll processing. The block copolymer may be polystyrene-block-polyethelyneoxide (PS:PEO), polystyrene-block-poly(methylmethacrylate) (PS:PMMA) or any other block copolymer. The pattern of the block copolymer may be cylindrical. A cylindrical pattern may include hexagonally arranged features with separations between 28 nm and 60 nm.

Processing may continue from block S2 to block S4, "Apply a precursor to the patterned block copolymer on the substrate to generate an infiltrated block copolymer on the substrate, wherein the precursor infiltrates into the first polymer block domain and generates a material in the first polymer block domain and the precursor does not infiltrate into the second polymer block domain." At block S4, a precursor may be applied to the patterned block copolymer. The precursor may infiltrate into the first polymer block domain and generate a material in the first polymer block domain. The precursor may not infiltrate into the second polymer block domain. The precursor may be a metal organic precursor such as tri-methyl aluminum (TMA). Water may react with the precursor, infiltrated in the first polymer block to form a material such as a metal oxide. For example, when the precursor is TMA, TMA may infiltrate in the first polymer block, in examples where the first polymer block is PMMA. TMA infiltrated in the PMMA polymer block may react with water and oxidize, forming a metal oxide, aluminum oxide ($Al_2O_3$). The metal oxide may be patterned and in the shape of the PMMA polymer block. The metal oxide may form a more robust template or mask that may be used for etching a nanostructure in the substrate to form a superhydrophobic surface.

Processing may continue from block S4 to block S6, "Apply a removal agent to the infiltrated block copolymer on the substrate to generate a pattern of the material on the substrate, wherein the removal agent is effective to remove the first polymer block domain and the second polymer block domain from the substrate, and is not effective to remove the material in the first polymer block domain." At block S6, a removal agent may be applied to the infused block copolymer to generate a pattern of the material on the substrate. The removal agent may be effective to remove the first and second polymer block domains. The removal agent may not be effective to remove the material in the first polymer block domain. The removal agent may be an oxygen plasma and may remove organic materials, including the first and second polymer blocks from the substrate. An inorganic template may be left on the substrate after applying the removal agent. The metal oxide may form a quasi-ordered array of uniform metal oxide dots with size and spacing determined by placement of the first polymer block. For example, $Al_2O_3$ metal oxide formed from PS:PMMA block copolymer and TMA precursor form an inorganic template with hexagonally arranged features with separations between 30 nm and 60 nm.

Processing may continue from block S6 to block S8, "Etch the substrate, wherein the pattern of the material on the substrate masks the substrate to pattern the etching and the etching is performed under conditions to produce nanostructures in the substrate." At block S8, the substrate may be etched. The pattern of the material on the substrate may mask the substrate to pattern the etching. The etching may be performed under conditions to produce nanostructures in the substrate. The etching may be done by plasma. The plasma may be applied to the substrate with the metal oxide template, to etch the substrate and result in the formation of nanostructures in the substrate. The plasma may produce a nanotextured substrate by etching a portion of the substrate exposed by the metal oxide template. The nanostructures etched in the substrate may be patterned by the metal oxide template. Plasma chemistry and etch time and conditions may be adjusted and may control height (e.g. a depth that the plasma etches into the substrate) as well as the profile of the nanostructures left in the substrate after etching. For example, the plasma may produce nanostructures in arrays with a cylindrical profiles or conical profiles. An aspect ratio of the formed nanostructures may be about 1:1 (height to average width ratio) to about 20:1 (height to average width ratio). In an example, the plasma may be 50% oxygen, 50% sulfur hexafluoride ($SF_6$) and may form cylindrical profile nanopillars at −100° C. In another example, the plasma may be hydrogen bromide (HBr):chlorine ($Cl_2$):oxygen ($O_2$) =100:100:25 standard cubic centimeter per minute (sccm) and may form conical profile nanopillars at room temperature.

Processing may continue from block S8 to block S10, "Remove the pattern of the material from the substrate." At block S10, the pattern of the material may be removed from the substrate. A wash solution may be applied to the substrate and the pattern of the material to remove the pattern of the material. The pattern of the material may be washed off of the substrate and may be washed off etched nanostructures with a wash solution. The wash solution may be a dilute acid, for example, buffered hydrofluoric acid (50:1). The removal of the pattern of the material may produce a nanotextured surface.

Processing may continue from block S10 to block S12, "Coat the nanostructures and the surface of the substrate with a hydrophobic coating." At block S12, a hydrophobic coating may be applied to the nanostructures and the surface of the substrate. The coating may be a hydrophobic coating, such as a waxy material, a TEFLON-like material, or a silane-based compound, for example, octadecyltrichlorosilane (OTS). The coating may be about 1-3 nm thick and may have a strong affinity to the substrate. The coating may be a monolayer about one molecule thick and may enhance the hydrophobicity of the nanotextured surface. The coated nanotextured surface may form a superhydrophobic surface.

A system in accordance with the present disclosure may generate self-cleaning, anti-icing, anti-fogging, and enhanced fluid transport surfaces. Surfaces formed by the presented methods may offer unprecedented resistance to water infiltrations and may be used in applications where water impacts a surface such as windshields. Surfaces may also be used for corrosion control. Select placing of hydrophobic surfaces may enhance microfluidic and lab-on-chip technologies. A system in accordance with the present disclosure may reduce maintenance intervals and maintenance cost and time. Surfaces such as windshields, window panels, optical displays, touch screens and solar panels may benefit from superhydrophobic surfaces.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for etching conical nanostructures in a substrate, the method comprising:
   depositing a patterned block copolymer on the substrate, wherein the patterned block copolymer includes a first polymer block domain and a second polymer block domain;
   applying a precursor to the patterned block copolymer on the substrate to generate an infiltrated block copolymer on the substrate, wherein the precursor infiltrates into the first polymer block domain and generates a material of metal oxide dots in the first polymer block domain and the precursor does not infiltrate into the second polymer block domain;
   applying a removal agent to the infiltrated block copolymer on the substrate to generate a pattern of the material on the substrate, wherein the removal agent is oxygen plasma and is effective to remove the first polymer block domain and the second polymer block domain from the substrate, and is not effective to remove the material in the first polymer block domain;
   plasma etching the substrate, wherein the pattern of the material on the substrate masks the substrate to pattern the etching and the etching is performed under etch times sufficiently long enough for metal oxide dots to fall off and form a superhydrophobic surface of etched conical nanostructures, and wherein the etched conical nanostructures have a re-entrant curvature;
   removing the pattern of the material from the substrate; and
   coating the etched conical nanostructures and the surface of the substrate with a hydrophobic coating.

2. The method of claim 1, wherein the nanostructures are patterned in an array with distances of about 30 nm to about 60 nm between nanostructure centers.

3. The method of claim 1, wherein an aspect ratio of the height to average width of the nanostructures is about 1:1 to about 20:1.

4. The method of claim 1, wherein the substrate is a polymer, silicon nitride, glass, or silicon.

5. The method of claim 1, wherein the block copolymer is polystyrene-block-poly(methylmethacrylate).

6. The method of claim 1, wherein the precursor is a metal organic precursor.

7. The method of claim 6, wherein the metal organic precursor is tri-methyl aluminum (TMA).

8. The method of claim 1, wherein the substrate is silicone, the plasma etching is with a plasma that is 50% oxygen, 50% sulfur hexafluoride ($SF_6$) and the plasma etching is performed at −100° C.

9. The method of claim 1, wherein the substrate is silicone, the plasma etching is hydrogen bromide (HBr):chlorine ($Cl_2$):oxygen ($O_2$)=100:100:25 standard cubic centimeter per minute (sccm) and the plasma etching is performed at room temperature.

10. The method of claim 1, wherein the removing the pattern of the material is performed with a diluted acid.

11. The method of claim 1, wherein the hydrophobic coating is octadecyltrichlorosilane.

12. A method for etching conical nanostructures in a substrate, the method comprising:
depositing a patterned block copolymer on the substrate, wherein the patterned block copolymer includes a first polymer block domain and a second polymer block domain;
applying a precursor to the patterned block copolymer on the substrate to generate an infiltrated block copolymer on the substrate, wherein the precursor infiltrates into the first polymer block domain and generates a material of metal oxide dots in the first polymer block domain and the precursor does not infiltrate into the second polymer block domain;
applying a removal agent to the infiltrated block copolymer on the substrate to generate a pattern of the material on the substrate, wherein the removal agent is oxygen plasma and is effective to remove the first polymer block domain and the second polymer block domain from the substrate, and is not effective to remove the material in the first polymer block domain;
plasma etching the substrate, wherein the pattern of the material on the substrate masks the substrate to pattern the etching and the etching is performed under etch times sufficiently long enough for metal oxide dots to fall off and form a superhydrophobic surface of etched conical nanostructures, and wherein the etched conical nanostructures have a re-entrant curvature and wherein the etched conical nanostructures are sized, shaped, and arranged so that when water contacts the etched conical nanostructures the water forms a contact angle above 160 degrees with the etched conical nanostructures in the substrate, and where the etched conical nanostructures are patterned in an array with distances of about 5 nm to about 100 nm;
removing the pattern of the material from the substrate; and
coating the etched conical nanostructures and the surface of the substrate with octadecyltrichlorosilane.

* * * * *